United States Patent
Nadar et al.

(10) Patent No.: US 7,889,899 B2
(45) Date of Patent: Feb. 15, 2011

(54) DIRECTIONAL STATISTICS VISUALIZATION TOOL

(75) Inventors: Mariappan S. Nadar, Plainsboro, NJ (US); Aurelien Flipo, Biot (FR)

(73) Assignee: Siemens Medical Solutions USA, Inc., Malvern, PA (US)

( * ) Notice: Subject to any disclaimer, the term of this patent is extended or adjusted under 35 U.S.C. 154(b) by 1060 days.

(21) Appl. No.: 11/656,233

(22) Filed: Jan. 22, 2007

(65) Prior Publication Data

US 2007/0258620 A1 Nov. 8, 2007

Related U.S. Application Data

(60) Provisional application No. 60/798,355, filed on May 5, 2006.

(51) Int. Cl.
G06K 9/00 (2006.01)
G06K 9/46 (2006.01)
G06K 9/62 (2006.01)
G01V 3/00 (2006.01)
A61B 5/05 (2006.01)

(52) U.S. Cl. ............ 382/128; 382/154; 382/192; 382/225; 324/307; 600/416

(58) Field of Classification Search ............ 382/154, 382/128, 192, 225; 324/307; 600/410, 416
See application file for complete search history.

(56) References Cited

U.S. PATENT DOCUMENTS 6,845,342 B1 * 1/2005 Basser et al. ............ 702/183

OTHER PUBLICATIONS

Koay et al, "The elliptical cone of uncertainty and its normalized measures in diffustion tensor imaging" Jun. 2008, IEEE transactions on medical imaging, vol. 27, No. 6, pp. 834-846.*

R.F. Dougherty A. Schwartzman and J.E. Taylor. Cross-sub ject comparison of principal diffusion direction maps. Magnetic Resonance in Medicine, 53(6):1423-1431, 2005.

R.H. Turi S. Ray. Determination of number of clusters in k-means clustering and application in colour image segmentation. In Proceedings of the 4th International Conference on Advances in Pattern Recognition and Digital Techniques (ICAPRDT'99), pp. 137-143, 1999.

* cited by examiner

*Primary Examiner*—Kathleen S Yuan
(74) *Attorney, Agent, or Firm*—Donald B. Paschburg; F. Chau & Associates, LLC

(57) ABSTRACT

A computer-implemented method for visualization of diffusion tensor images includes providing a diffusion tensor image input and providing a volume of interest within the diffusion tensor image input. The method includes determining a plurality of direction-based classifications of the volume of interest, wherein classes are defined by a set of parameters, An optimal solution is then selected within the classifications by using a criterion defined as a ratio of inertia indicators. To represent the chosen classification, a cone graph is determined for each of the directional classes to be displayed or stored, each cone pair being the geometrical interpretation of the class parameters. The method further includes determining a spherical scatterplot of the volume of interest augmented with a cone graph for visualization of at least one of the directional classes, and displaying and/or storing the scatterplot.

14 Claims, 4 Drawing Sheets

DIRECTIONAL STATISTICS VISUALIZATION TOOL

CROSS-REFERENCE TO RELATED APPLICATIONS

This application claims the benefit of Provisional Application No. 60/798,355 filed on May 5, 2006 in the United States Patent and Trademark Office, the content of which is herein incorporated by reference in its entirety.

BACKGROUND OF THE INVENTION

1. Technical Field

The present disclosure relates to diffusion tensor imaging, and more particularly to directional statistics visualization for diffusion tensor imaging (DTI).

2. Description of Related Art

Diffusion tensor image scans comprise at least six gradient directions, sufficient to determine a diffusion tensor in, for example, a brain scan. From the diffusion tensor, diffusion anisotropy measures such as the Fractional Anisotropy (FA) can be determined. Moreover, the principal direction of the diffusion tensor can be used to infer white-matter connectivity of the brain and model it as a tract.

A visualization strategy for such a tract is to render a diffusion ellipsoid at a subset of data points. Since a three-dimensional field of ellipsoids would occlude each other, this visualization is typically done for two-dimensional slices of data. Additionally, only ellipsoids on a sparse grid can be rendered in order for each ellipsoid to be discerned. This type of visualization can become visually cluttered, obscuring the information intended to be conveyed.

Previous work for visualization has included a texture based approach, generating an image by blurring a source image in the direction of the vector field at each point. Line integral convolution (LIC) is one technique for implementing this visualization. Another approach with substantially similar visual results uses the solution of a partial differential equation (PDE).

Rendering techniques used for texture-based DT-MRI visualization include planar surface rendering and volume rendering. In planar surface rendering, the image is determined for a planar slice of the DT-MRI data, and displayed as a textured quadrilateral. The volume rendering technique includes determining the texture at each point in the volume and rendering the field by ray-casting, or some similar technique. These techniques can be computationally expensive.

Therefore, a need exists for directional statistics visualization for diffusion tensor imaging.

SUMMARY OF THE INVENTION

According to an embodiment of the present disclosure, a computer-implemented method for visualization of diffusion tensor images includes providing a diffusion tensor image input and providing a volume of interest within the diffusion tensor image input. The method includes determining a plurality of direction-based classifications of the volume of interest, wherein classes are defined by a set of parameters, An optimal solution is then selected within the classifications by using a criterion defined as a ratio of inertia indicators. To represent the chosen classification, a cone graph is determined for each of the directional classes to be displayed or stored, each cone pair being the geometrical interpretation of the class parameters. The method further includes determining a spherical scatterplot of the volume of interest augmented with a cone graph for visualization of at least one of the directional classes, and displaying and/or storing the scatterplot.

According to an embodiment of the present disclosure, a computer readable medium is provided embodying instructions executable by a processor to perform a method for visualization of diffusion tensor images. The method includes providing a diffusion tensor image input, providing a volume of interest within the diffusion tensor image input, determining a plurality of direction-based classifications of the volume of interest, wherein classes are defined by a set of parameters, determining an optimal number of classes using a criterion defined as a ratio of inertia indicators, and determining a spherical scatterplot of the volume of interest augmented with a cone graph for visualization of at least one of the directional classes.

BRIEF DESCRIPTION OF THE DRAWINGS

Preferred embodiments of the present invention will be described below in more detail, with reference to the accompanying drawings.

DETAILED DESCRIPTION OF PREFERRED EMBODIMENTS

According to an embodiment of the present disclosure, a visualization tool for direction data augments a spherical visualization of diffusion tensor voxels with directional information using cone graphs.

Figure 1A:
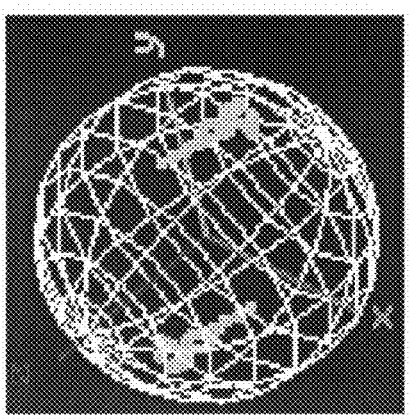
FIG. 1A is an example of an original scatterplot.

One way to represent diffusion tensor data is to display a scatterplot of unit vectors on a 3 dimensional sphere (for example, see FIG. 1A). However, this approach has a limitation: as the number of dots grows bigger, it becomes harder to distinguish main directions from noise.

Figure 1B:
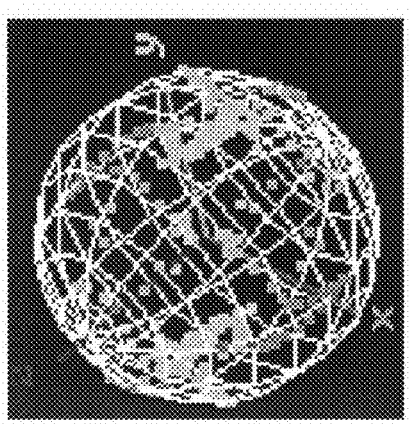
FIG. 1B is an example of a crowded scatterplot.
Figure 1C:
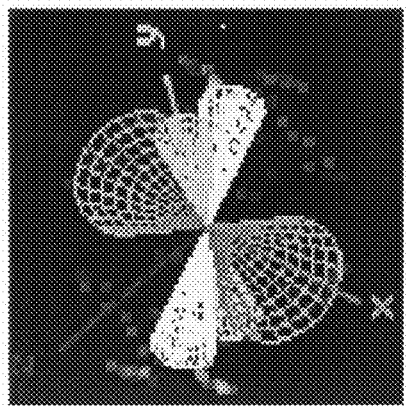
FIG. 1C is a scatterplot after classification according to an embodiment of the present disclosure.

This problem appears in DTI frameworks: when a user defines a Volume of Interest (VOI), a main direction is determined and plotted for each voxel that is selected. If many voxels are selected, this will result in a scatterplot with so many dots that it becomes substantially impossible to distinguish significant clusters (see for example, FIG. 1B). According to an embodiment of the present disclosure, problem was approached by sorting vectors into a small number of classes. Each class can then be displayed as a cone graph, with an axis along the mean direction and a base width depending on the sample dispersion (a thin cone indicates a low dispersion). FIG. 1C shows an example of such representation, including three sets of cone pairs each corresponding to a class of vectors.

The classification of directional data can be determined using classification methods such as k-means or EM (Expectation Maximization). K-means is a method that is based on sorting data points according to their distance to a class center. This requires the determination of a mean to define the class center, and a distance metric. These are trivial tasks in an Euclidian space, but handling directional data is more complex. According to an embodiment of the present disclosure, the data points are main eigenvectors of the tensors in the VOI. Each point is considered as the tip of a unit vector. It should also be noted that a single direction can be equivalently represented as two opposite vectors. For this reason, a vector and its opposite are regarded as strictly equivalent in the determination.

Figure 2:
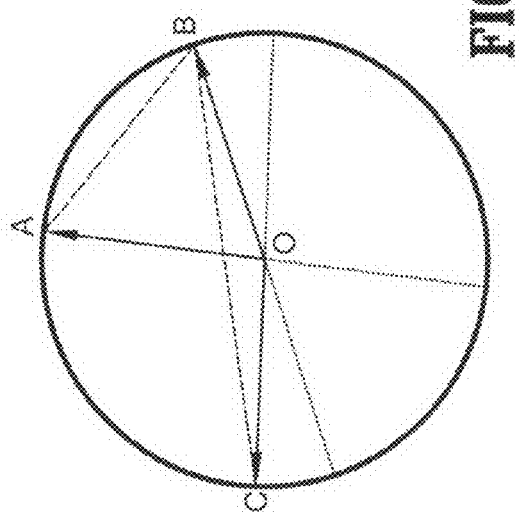
FIG. 2 is a diagram of distances in a 2D directional space according to an embodiment of the present disclosure.

FIG. 2 shows why a Euclidian distance is not suitable for directional data: in a directional space, points B and C are closer to each other than A and B. With the Euclidian distance, however, AB<BC. Thus, the distance between A and C should rather be defined as the minimal angle between directions (OA) and (OC), e.g.:

$$d(A,C) = \cos^{-1}(|\vec{OA} \cdot \vec{OC}|) \qquad (1)$$

Similarly, the mean of a set of points cannot be determined by averaging the values of each variable. Instead, the mean distance may be used: $\bar{x}$ is the main eigenvector of the scatter matrix $\bar{T}$ defined as:

$$\bar{T} = \frac{1}{n}\sum_{i=1}^{n} x_i x_i^T \qquad (2)$$

where the $x_i$ are the data points.

It is also possible to determine the mean of a set of weighted directions. In this case, the formula will be:

$$\bar{T} = \frac{\sum_{i=1}^{n} w_i x_i x_i^T}{\sum_{i=1}^{n} w_i} \qquad (3)$$

wherein the $w_i$ are the weights of the data points (unit vectors representing a direction).

Referring to a density function, the EM algorithm is another, more elaborate way of classifying data as compared to using equation (3). The EM algorithm uses a probability density function (PDF). In the Euclidian space, a PDF such as the multivariate normal distribution may be used, for example:

$$f(x|\mu,\Sigma) = (2\pi)^{-p/2} \det(\Sigma)^{-1/2} e^{(-1/2(x-\mu)^T \Sigma^{-1}(x-\mu))} \qquad (4)$$

where $\mu$ and $\Sigma$ are the mean and covariance.

With directional data, a similar PDF featuring a mixture of distributions needs to be found, each distribution being centered around the mean direction of one of the classes. An exemplary density function is the bipolar Watson distribution. The Watson distribution is defined as follows:

$$f(x|\mu,\kappa) = C(\kappa) e^{(\kappa(\mu^T x)^2)} \qquad (5)$$

$$C(\kappa) = \frac{\kappa}{\pi e^\kappa} \qquad (6)$$

wherein parameters $\mu$ and $\kappa$ respectively represent a sample mean and concentration. $C(\kappa)$ is a normalization constant.

The EM algorithm needs the estimation of parameters $\mu$ and $\kappa$. The maximum likelihood estimates may be given as:

$$\hat{\mu} = \bar{\mu} \qquad (7)$$

where $\bar{\mu}$ is the sample mean direction computed from the scatter matrix as explained in equation (2).

$$\hat{\kappa} = \frac{1}{1-\lambda} \qquad (8)$$

where $\lambda$ is the main eigenvalue of the scattermatrix.

$\kappa$ is an indicator of the sample concentration. From this variable, it is possible to compute an angle dispersion $\theta$, which is the average angle between $\hat{x}$ and the $x_i$. According to an embodiment of the present disclosure, this angle dispersion is used to set the width of the cones for each class, as shown in FIG. 1C.

$$\theta = \sin^{-1}\left(\frac{1}{\sqrt{\kappa}}\right) \qquad (9)$$

Figures 3A, 3B, 3C:
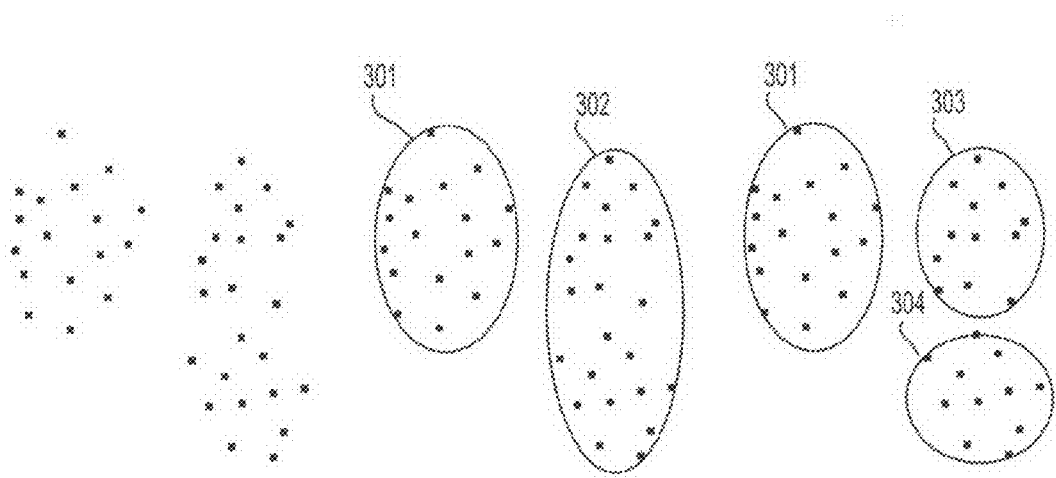
FIGS. 3A-C illustrate the detection of an optimal number of clusters according to an embodiment of the present disclosure.

For detecting the optimal number of classes, for example, see FIGS. 3A-C, the k-means and EM algorithms share the same drawback: they are both unable to detect the optimal number of classes to use when sorting the data points. In fact, defining this optimal number can be quite troublesome, and several solutions may be acceptable. In FIGS. 3A-C a set of k-means classifications is shown, including input information in FIG. 3A, and two possible results that identified 2 classes 301-302 (see FIG. 3B) and 3 classes 301, 303 and 304 (see FIG. 3C), respectively.

A way of determining an optimal result is to choose a criterion and to try to find a classification that will optimize it. One example of a criterion is defined as a ratio of inertia indicators:

$$intra = \frac{1}{N}\sum_{k=1}^{K}\sum_{x \in C_k} \|x - z_k\|^2 \qquad (10)$$

where N is the number of data items, K is the number of clusters, and $z_k$ is the cluster center of cluster $C_k$, wherein $C_k$ are the classes containing a subset of the data.

$$inter = \min(\|z_k - z_l\|^2), \quad k \neq l \qquad (11)$$

$$validity = \frac{inter}{intra}, \quad \text{criterion to be maximized} \qquad (12)$$

An optimal number of clusters is then determined by performing the classification with different values of K. The result that yields the best criterion value, e.g., a best fit to the data items, will be considered as optimal.

Referring now to the visualization of direction classes, a visualization of direction data implements the clustering method in the DTI framework. The data itself comes from a set of voxels selected by the user. For each of these voxels, a principal diffusion direction is determined and plotted on a sphere using a color mapping to highlight the direction, as in FIG. 1A. Each voxel is also weighted according to its fractional anisotropy (FA): voxels with isotropic diffusion are less significant for directional statistics and should have a lower impact on statistical computations and on the final display. Voxels with a higher anisotropy have a higher weight, and their impact in the computation of a class center is more important.

Once the classification is done, the scatterplot can be updated by adding a cone graph in which each cone pair represents a class containing a subset of the data points. Each cone has its axis along the class mean direction, and its width is set according to the angle dispersion defined in equation (9). The dots on the scatterplot are colored according to their class. To increase visibility, each dot has an alpha value equal to its weight. Thus, a dot with a low weight will appear almost transparent. Similarly, the voxels in the volume of interest also receive a color and opacity according to their classification and FA value. This allows a quick visualization of the regions through which coherent fiber bundles pass.

Figure 4:
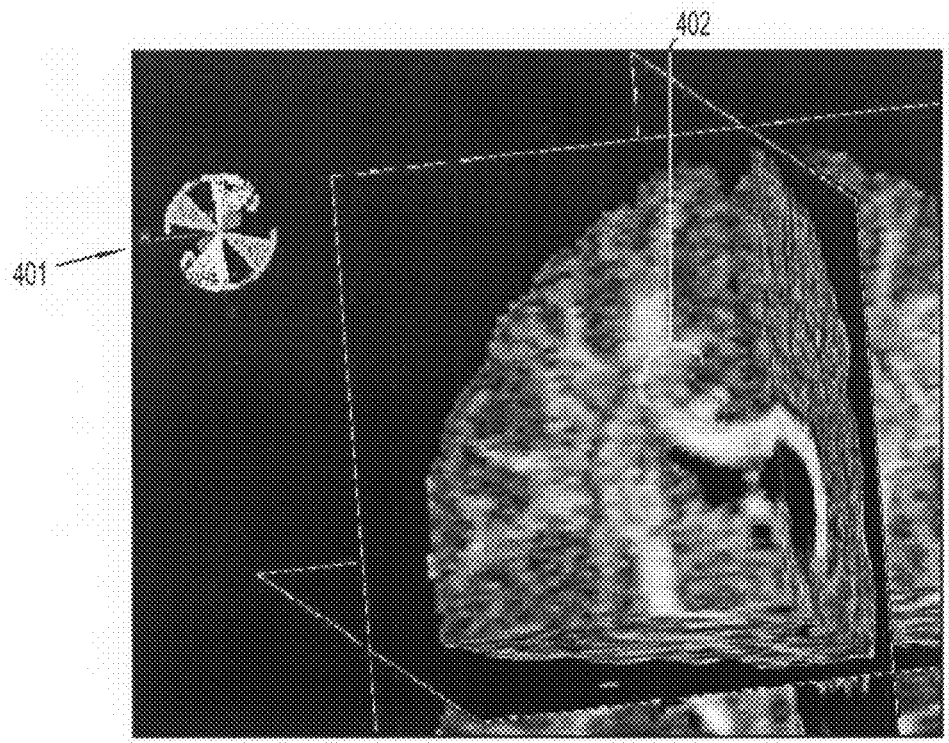
FIG. 4 is an exemplary visualization of directional statistics according to an embodiment of the present disclosure.

FIG. 4 is an exemplary illustration of a visualization of directional statistics, including a cone graph 401 augmenting a three dimensional visualization of a brain scan. Each cone (cone pair) of the cone graph may be colored to distinguish from other classes of vectors. These colors may also be used in the brain scan to visualize a volume of interest, e.g. 402, which includes subsets having different colors according to the classification.

Figure 5:
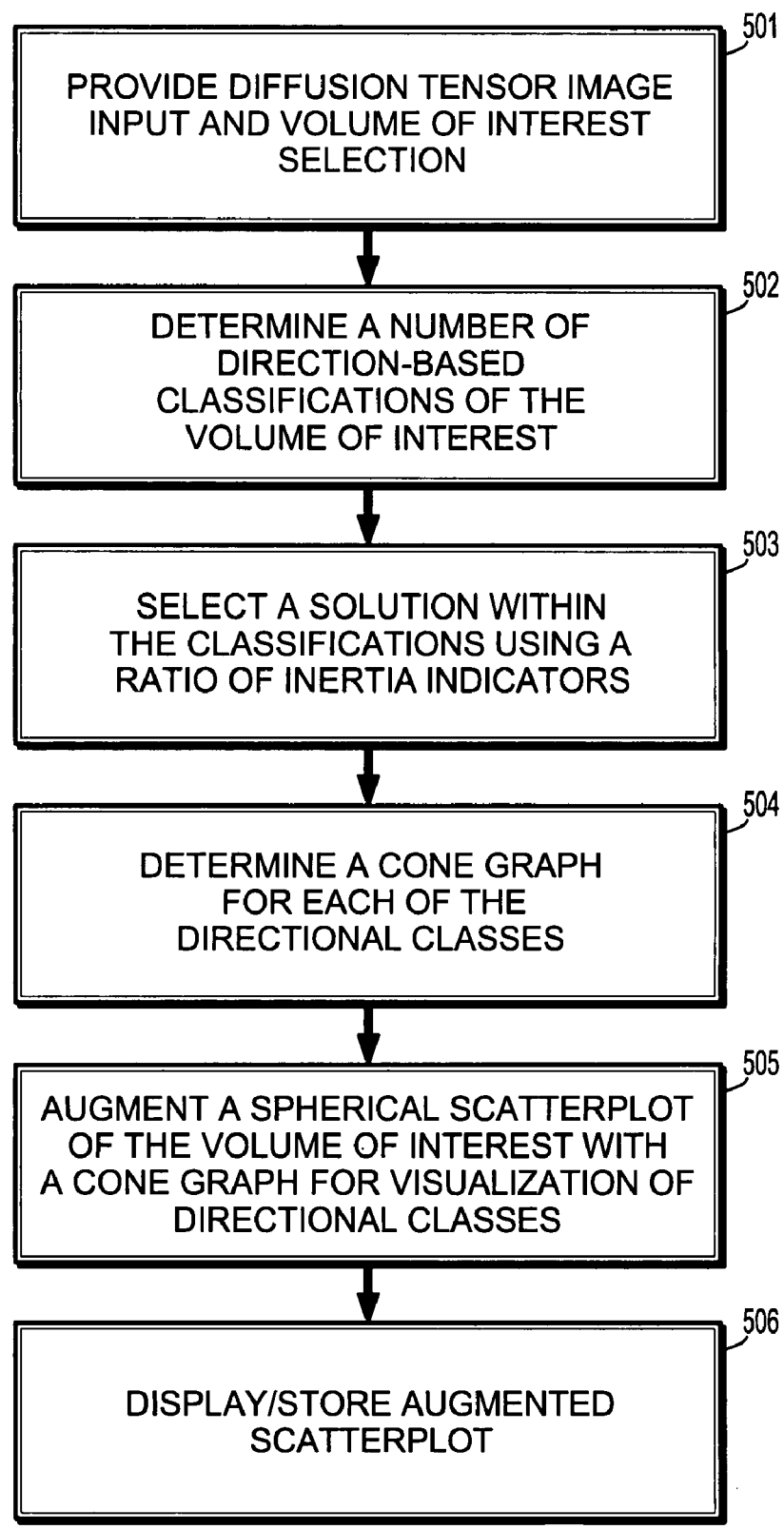
FIG. 5 is a flow chart of a method for diffusion tensor image visualization according to an embodiment of the present disclosure.

Referring to FIG. 5, a method for visualization of diffusion tensor images includes providing a diffusion tensor image input and providing a volume of interest within the diffusion tensor image input 501. The method includes determining a plurality of direction-based classifications of the volume of interest, wherein classes are defined by a set of parameters 502. An optimal solution is then selected within the classifications by using a criterion defined as a ratio of inertia indicators 503. To represent the chosen classification, a cone graph is determined for each of the directional classes to be displayed or stored, each cone pair being the geometrical interpretation of the class parameters 504. The method further includes determining a spherical scatterplot of the volume of interest augmented with a cone graph for visualization of at least one of the directional classes 505, and displaying and/or storing the scatterplot 506.

It is to be understood that the present invention may be implemented in various forms of hardware, software, firmware, special purpose processors, or a combination thereof. In one embodiment, the present invention may be implemented in software as an application program tangibly embodied on a program storage device. The application program may be uploaded to, and executed by, a machine comprising any suitable architecture.

Figure 6:
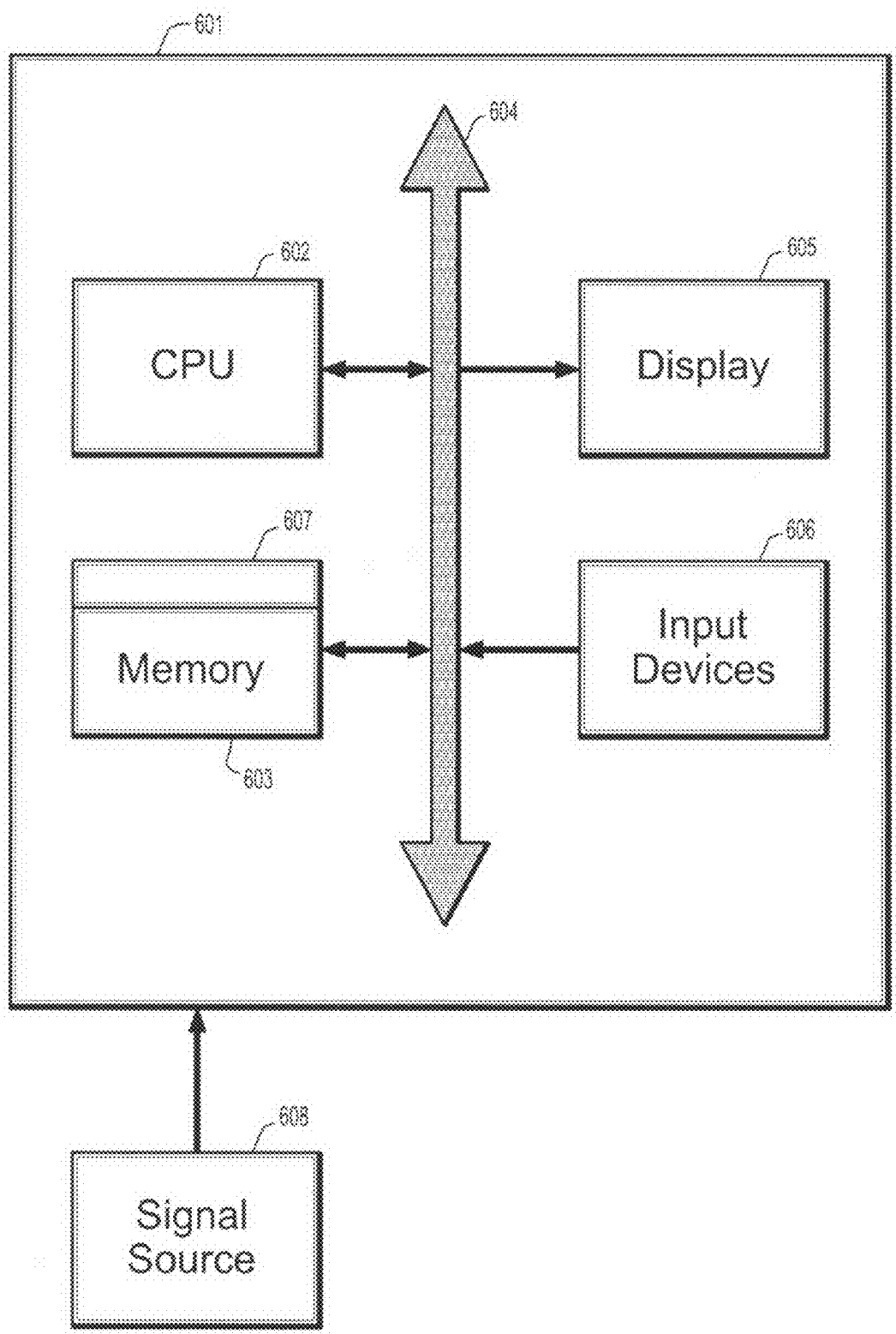
FIG. 6 is a diagram of a system according to an embodiment of the present disclosure.

Referring to FIG. 6, according to an embodiment of the present disclosure, a computer system 601 for a directional statistics visualization tool can comprise, inter alia, a central processing unit (CPU) 602, a memory 603 and an input/output (I/O) interface 604. The computer system 601 is generally coupled through the I/O interface 604 to a display 605 and various input devices 606 such as a mouse and keyboard. The support circuits can include circuits such as cache, power supplies, clock circuits, and a communications bus. The memory 603 can include random access memory (RAM), read only memory (ROM), disk drive, tape drive, etc., or a combination thereof. The present invention can be implemented as a routine 607 that is stored in memory 603 and executed by the CPU 602 to process the signal from the signal source 608. As such, the computer system 601 is a general-purpose computer system that becomes a specific purpose computer system when executing the routine 607 of the present disclosure.

The computer platform 601 also includes an operating system and microinstruction code. The various processes and functions described herein may either be part of the microinstruction code or part of the application program (or a combination thereof), which is executed via the operating system. In addition, various other peripheral devices may be connected to the computer platform such as an additional data storage device and a printing device.

It is to be further understood that, because some of the constituent system components and method steps depicted in the accompanying figures may be implemented in software, the actual connections between the system components (or the process steps) may differ depending upon the manner in which the present invention is programmed. Given the teachings of the present invention provided herein, one of ordinary skill in the related art will be able to contemplate these and similar implementations or configurations of the present invention.

Having described embodiments for a system and method for a directional statistics visualization tool, it is noted that modifications and variations can be made by persons skilled in the art in light of the above teachings. It is therefore to be understood that changes may be made in embodiments of the present disclosure that are within the scope and spirit thereof.

What is claimed is:

1. A computer-implemented method for visualization of diffusion tensor images comprising:
   providing a diffusion tensor image input produced by a magnetic resonance imaging device, the diffusion tensor image input corresponding to a brain;
   providing a volume of interest within the diffusion tensor image input;
   determining a plurality of directional classes of the volume of interest, wherein the directional classes are defined by a set of parameters;
   determining an optimal number of the directional classes using a criterion defined as a ratio of inertia indicators;
   determining a spherical scatterplot of the volume of interest augmented with a cone graph for visualization of at least one of the directional classes; and
   displaying the scatterplot.

2. The computer-implemented method of claim 1, wherein the volume of interest is a set of voxels selected by a user.

3. The computer-implemented method of claim 2, further comprising determining a principal diffusion direction for each voxel.

4. The computer-implemented method of claim 3, further comprising plotting each voxel and its principal diffusion direction on the spherical scatterplot indicating a direction.

5. The computer-implemented method of claim 3, further comprising plotting each voxel and its principal diffusion direction on the spherical scatterplot indicating a weight according to a fractional anisotropy of a respective voxel.

6. The computer-implemented method of claim 3, wherein each voxel and its principal diffusion direction are plotted on the spherical scatterplot, the method further comprising:
   indicating a direction by color; and
   indicating a fractional anisotropy by opacity.

7. The computer-implemented method of claim 1, further wherein each cone graph is a geometrical interpretation of the set of parameters defining a respective directional class.

8. A non-transitory computer readable medium embodying an application program executable by a processor to perform a method for visualization of diffusion tensor images, the method comprising:

provided a diffusion tensor image input;

providing a volume of interest within the diffusion tensor image input;

determining a plurality of directional classes of the volume of interest, wherein the directional classes are defined by a set of parameters;

determining an optimal number of the directional classes using a criterion defined as a ratio of inertia indicators; and determining a spherical scatterplot of the volume of interest augmented with a cone graph for visualization of at least one of the directional classes.

9. The method of claim 8, wherein the volume of interest is a set of voxels selected by a user.

10. The method of claim 9, further comprising determining a principal diffusion direction for each voxel.

11. The method of claim 10, further comprising plotting each voxel and its principal diffusion direction on the spherical scatterplot indicating a direction.

12. The method of claim 10, further comprising plotting each voxel and its principal diffusion direction on the spherical scatterplot indicating a weight according to a fractional anisotropy of a respective voxel.

13. The method of claim 10, wherein each voxel and its principal diffusion direction are plotted on the spherical scatterplot, the method further comprising:

indicating a direction by color; and indicating a fractional anisotropy by opacity.

14. The method of claim 8, wherein each cone graph is a geometrical interpretation of the set of parameters defining a respective directional class.

* * * * *